(12) United States Patent
Otsuka

(10) Patent No.: US 10,366,764 B2
(45) Date of Patent: Jul. 30, 2019

(54) SENSE AMPLIFIER FOR DETECTING DATA READ FROM MEMORY CELL

(71) Applicant: LAPIS Semiconductor Co., Ltd., Yokohama (JP)

(72) Inventor: Masayuki Otsuka, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/820,379

(22) Filed: Nov. 21, 2017

(65) Prior Publication Data

US 2018/0151233 A1    May 31, 2018

(30) Foreign Application Priority Data

Nov. 25, 2016 (JP) ................................. 2016-228830

(51) Int. Cl.
*G11C 16/04* (2006.01)
*G11C 16/26* (2006.01)
*G11C 7/06* (2006.01)

(52) U.S. Cl.
CPC .............. *G11C 16/26* (2013.01); *G11C 7/062* (2013.01); *G11C 7/065* (2013.01); *G11C 16/0483* (2013.01)

(58) Field of Classification Search
CPC . G11C 11/4091; G11C 7/065; G11C 16/0483; G11C 16/26; G11C 7/06; G11C 7/22
USPC ................. 365/205, 207, 185.23, 63, 185.17
See application file for complete search history.

(56) References Cited

U.S. PATENT DOCUMENTS

| | | | |
|---|---|---|---|
| 6,185,256 B1* | 2/2001 | Saito ........................ | G11C 7/04 326/20 |
| 6,882,591 B2* | 4/2005 | Winograd ........... | G06F 13/4086 365/230.03 |
| 7,505,532 B2* | 3/2009 | Saito ........................ | G11C 7/04 327/52 |
| 7,580,273 B2* | 8/2009 | Rao ...................... | G11C 7/1006 365/189.05 |
| 7,869,244 B2* | 1/2011 | Rao ...................... | G11C 7/1006 365/189.05 |
| 2005/0259489 A1* | 11/2005 | Ohsawa .................. | G11C 11/14 365/205 |

FOREIGN PATENT DOCUMENTS

JP         2001-250391 A       9/2001

* cited by examiner

*Primary Examiner* — Gene N Auduong
(74) *Attorney, Agent, or Firm* — Rabin & Berdo, P.C.

(57) ABSTRACT

Provided is a sense amplifier circuit for detecting data having been read from a memory cell. The sense amplifier circuit includes: a potential control unit for controlling the potential of a bit line connected to a memory cell; a current amplifier unit for amplifying a readout current flowing from the memory cell to the bit line so as to produce an amplified current; and a detection unit for detecting data having been read from the memory cell on the basis of the amplified current. The potential control unit controls the potential of the bit line in a data readout duration, and the data readout duration includes a current amplification duration, and the current amplifier unit amplifies the readout current in the current amplification duration.

11 Claims, 10 Drawing Sheets

SENSE AMPLIFIER FOR DETECTING DATA READ FROM MEMORY CELL

BACKGROUND OF THE INVENTION

1. Field of the Invention

The present invention relates to a sense amplifier circuit.

2. Description of the Related Art

Sense amplifier circuits are employed as a circuit for detecting data having been read from a memory cell. Known as such a sense amplifier circuit is a so-called current detection type sense amplifier circuit which detects a current flowing from a selected memory cell into a bit line to thereby determine data read from the memory cell.

For example, the current detection type sense amplifier circuit is configured from a transistor and an inverter, and has a potential control unit for controlling the potential of a bit line, and a detection unit for detecting readout data on the basis of a readout current. Such a sense amplifier circuit controls the potential of the bit line, and compares a node potential that is varied according to the current (readout current) flowing from the memory cell into the bit line with the threshold potential of the inverter. Then, on the basis of the comparison result, the inverter outputs a signal of a high level or low level, thereby determining data stored in the memory cell (for example, Japanese Patent Application Laid-Open No. 2001-250391).

SUMMARY OF THE INVENTION

In the sense amplifier circuit as described above, when the readout current flowing into the bit line is low, a current amplifier unit is required in order to amplify the readout current. In the sense amplifier circuit including the current amplifier unit, the whole circuit consumes a great deal of current because control is provided so that in the memory readout duration, both the potential control unit and the current amplifier unit are in an ON state (an operating state).

Furthermore, for readout in long cycles, lower power consumption is typically required than for readout in short cycles. However, in the sense amplifier circuit stated above, the requirement for lower power consumption could not be satisfied because current consumption per hour is constant in the readout duration.

A sense amplifier circuit according to the present invention detects data read from a memory cell. The sense amplifier circuit includes: a potential control unit configured to control a potential of a bit line connected to the memory cell; a current amplifier unit configured to amplify, when activated, a readout current flowing from the memory cell into the bit line so as to produce an amplified current; and a detection unit configured to detect data read from the memory cell on the basis of the amplified current. In the sense amplifier circuit, the potential control unit controls the potential of the bit line in a data readout duration, the data readout duration including a current amplification duration, and the current amplifier unit amplifies the readout current in the current amplification duration.

According to the sense amplifier circuit of the present invention, it is possible to detect data read from a memory cell while reducing current consumption.

BRIEF DESCRIPTION OF THE DRAWINGS

The features of the present invention will be described in the description below with reference to the attached drawings, in which.

DETAILED DESCRIPTION OF THE INVENTION

A description will next be given of embodiments of the present invention with reference to the drawings. Note that throughout the descriptions of each embodiment below and the attached drawings, substantially the same or equivalent portions will be denoted by the same reference symbols.

First Embodiment

Figure 1:
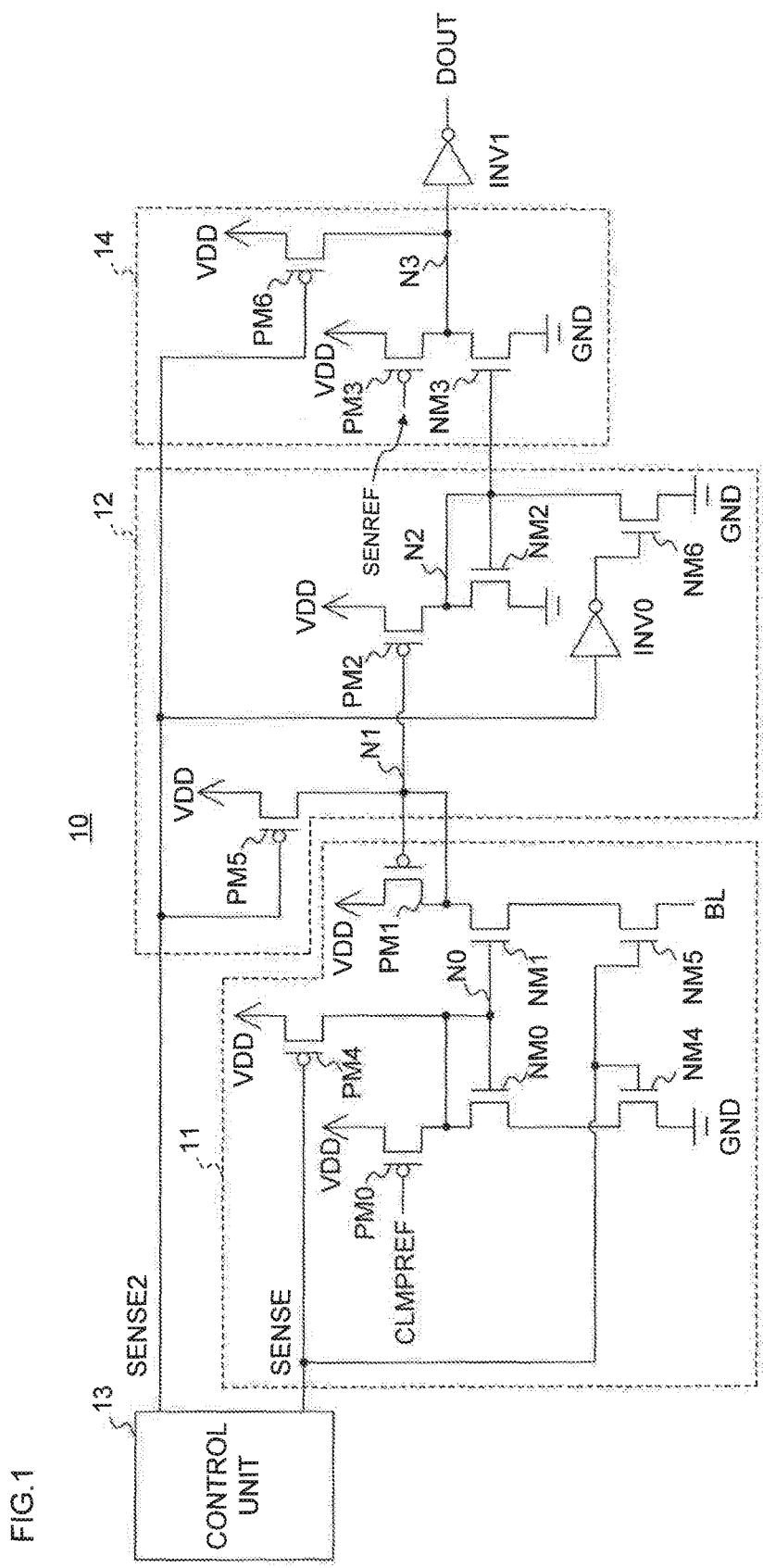
FIG. 1 is a circuit diagram illustrating a configuration of a sense amplifier circuit of a first embodiment.

FIG. 1 is a circuit diagram illustrating a configuration of a sense amplifier circuit 10 according to a first embodiment of the present invention. The sense amplifier circuit 10 includes a potential control unit 11 for controlling the potential of a bit line BL in a memory cell array, a current amplifier unit 12 for amplifying the readout current from a memory cell when it is activated, a control unit 13 for controlling the operational timing of the circuit, a readout data detection unit 14 for detecting readout data on the basis of the amplified readout current (amplified current), and an inverter INV1 acting as an output unit for outputting a detection result.

The potential control unit 11 is configured from transistors PM0, PM1, and PM4, which are each a P channel type MOS transistor of a first conductivity type, and transistors NM0, NM1, NM4, and NM5, which are each an N channel type MOS transistor of a conductivity type opposite to the first conductivity type.

The source of the transistor PM0 is connected to the power supply terminal that receives a supply voltage VDD. The drain of the transistor PM0 is connected to the drain of the transistor NM0 and is also connected to a node N0 which connects between the gate of the transistor NM0 and the gate of the transistor NM1. The gate of the transistor PM0 is supplied with a control voltage CLMPREF for controlling the potential of the bit line BL in the memory array.

The source of the transistor PM4 is connected to the power supply terminal that receives the supply voltage VDD. The gate of the transistor PM4 is connected to the control unit 13, and receives a first control signal SENSE from the control unit 13. The drain of the transistor PM4 is connected to the gates of the transistors NM0 and NM1 via the node N0 and is also connected to the drains of the transistors PM0 and NM0.

The source of the transistor PM1 is connected to the power supply terminal that receives the supply voltage VDD. The gate and the drain of the transistor PM1 are connected together, and connected to the gate of a transistor PM2 in the current amplifier unit 12 via a node N1.

The transistors NM0, NM1, NM4, and NM5 constitute a current mirror circuit. The source of the transistor NM0 is connected to the drain of the transistor NM4. The gate of the transistor NM0 is connected to the gate of the transistor NM1 via the node N0. The drain of the transistor NM0 is connected to the drain of the transistor PM4.

The source of the transistor NM4 is grounded. The gate of the transistor NM4 is connected to the control unit 13, and receives the first control signal SENSE.

The source of the transistor NM1 is connected to the drain of the transistor NM5. The drain of the transistor NM1 is connected to the drain of the transistor PM1, and is also connected to the node N1.

The source of the transistor NM5 is connected to the bit line BL in the memory array. The gate of the transistor NM5 is connected to the control unit 13, and receives the first control signal SENSE.

The potential control unit 11 operates by receiving the first control signal SENSE from the control unit 13. More specifically, the application of a high level signal at a power supply level (hereafter referred to as "H") causes an active mode, whereas the application of a low level signal at the ground level (hereafter referred to as "L") causes a standby mode. In the active mode, a current corresponding to the control voltage CLMPREF flows through the transistor NM0, so that the potential of the node N0 is determined. This causes the bit line BL to be charged to provide control so that the potential of the bit line BL is at a predetermined potential. Note that in this embodiment, during a readout duration TCYC, the first control signal SENSE with a signal level of "H" is supplied to the potential control unit 11. That is, in the readout duration TCYC, control is provided so that the potential control unit 11 is in the active mode.

The current path through the transistors PM1, NM1, and NM5 allows a current (readout current) to flow corresponding to data read from the memory cell array. More specifically, if the data read from the memory cell selected in the memory cell array is "0," then no current flows, whereas if the data read is "1," then a current flows.

Figure 2:
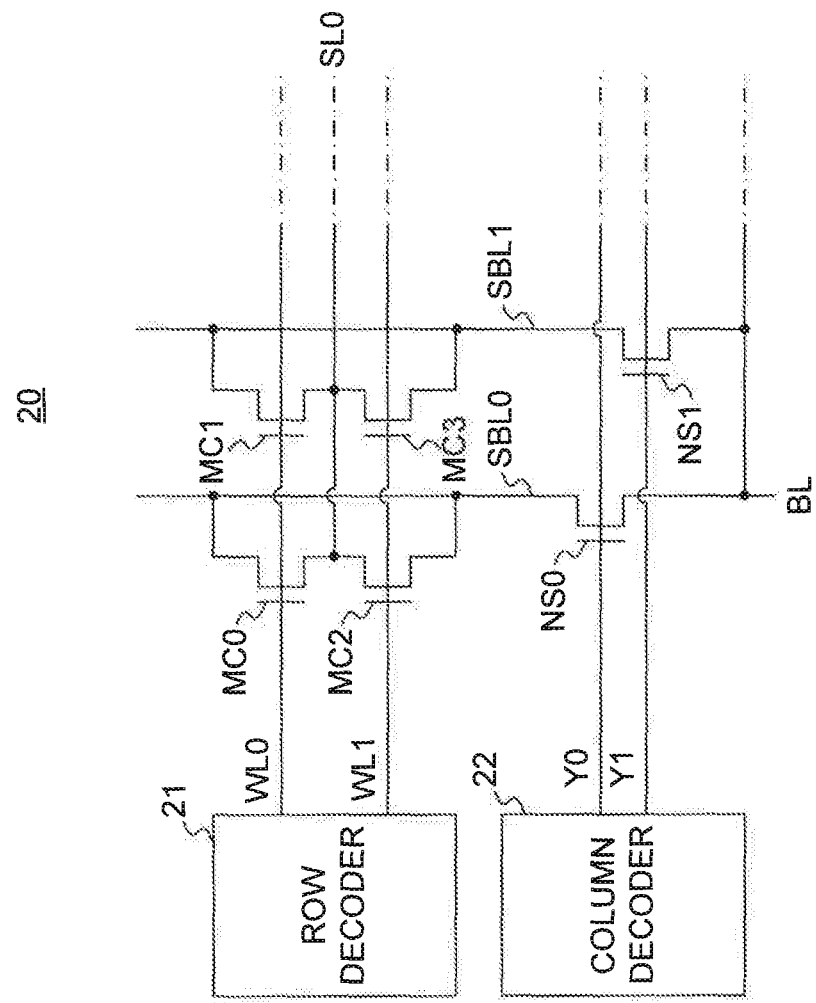
FIG. 2 is a view schematically illustrating a configuration of memory cells.

FIG. 2 is a view schematically illustrating the configuration of the memory cell array 20. The memory cell array 20 is configured from a row decoder 21, a column decoder 22, memory cell transistors MC0, MC1, MC2, and MC3, and NMOS transistors NS0 and NS1 which are each an N channel type MOS transistor.

Furthermore, the memory cell array 20 is provided with word lines WL0 and WL1, sub-bit lines SBL0 and SBL1, and column signal lines Y0 and Y1. The word lines WL0 and WL1, or signal lines each connected in common to the gates of the memory cell transistors in a row direction, are connected to the row decoder 21. The column signal lines Y0 and Y1, or signal lines each connected to the gate of the respective NMOS transistors NS0 and NS1, are connected to the column decoder 22. The sub-bit lines SBL0 and SBL1 are connected to the bit line BL.

The memory cell transistors MC0 to MC3, or an N channel type MOS transistor with a floating gate, are disposed in a matrix. The memory cell transistors MC0 and MC1 are connected with the word line WL0 in common. The memory cell transistors MC2 and MC3 are connected with the word line WL1 in common. The sources of the memory cell transistors MC0 to MC3 are connected in common to a source line SL0. The drains of the memory cell transistors MC0 and MC2 are connected to the sub-bit line SBL0. The drain of each of the memory cell transistors MC1 and MC3 is connected to the sub-bit line SBL1.

The source of the transistor NS0 is connected to the sub-bit line SBL0. The source of the transistor NS1 is connected to the sub-bit line SBL1. The drains of the transistors NS0 and NS1 are connected in common to the bit line BL.

The word lines WL0 and WL1 and the column signal lines Y0 and Y1 are supplied with an "H" or "L" signal, so that any one of the memory cell transistors MC0 to MC3 is selected. For example, the memory cell transistor MC3 is selected if the WL0, the WL1, the Y0, and the Y1 are supplied with an "L" signal, an "H" signal, an "L" signal, and an "H" signal, respectively. Referring back to FIG. 1, the current amplifier unit 12 is configured from the transistors PM2 and PM5, which are each a P channel type MOS transistor; and the transistors NM2 and NM6, which are each an N channel type MOS transistor. The readout data detection unit 14 is configured from the transistors PM3 and PM6, which are each a P channel type MOS transistor; and the transistor NM3 which is an N channel type MOS transistor. The transistors PM1 and PM2, and NM2 and NM3 each constitute a current mirror so as to amplify the current flowing through the transistor PM1 in the potential control unit 11, for example, twice.

The source of the transistor PM5 is connected to the power supply terminal that receives the supply voltage VDD. The drain of the transistor PM5 is connected to the gates of the transistors PM1 and PM2 via the node N1. The gate of the transistor PM5 is connected to the control unit 13 and receives a second control signal SENSE2 from the control unit 13.

The source of the transistor PM2 is connected to the power supply terminal that receives the supply voltage VDD. The gate of the transistor PM2 is connected to the gate of the transistor PM1 via the node N1. The drain of the transistor PM2 is connected to the drain of the transistor NM2, and connected to the gates of the transistors NM2 and NM3 via a node N2.

The source of the transistor PM3 is connected to the power supply terminal that receives the supply voltage VDD. The drain of the transistor PM3 is connected to the drain of the transistor NM3, and is connected to an input terminal of an inverter INV1 via a node N3. The transistor PM3 is supplied with a reference current control voltage SENREF for determining data in the memory cell.

The source of the transistor NM2 is grounded. The gate and the drain of the transistor NM2 are connected together via the node N2 and connected to the gate of the transistor NM3.

The source of the transistor NM3 is grounded. The gate of the transistor NM3 is connected to the gate of the transistor NM2. The drain of the transistor NM3 is connected to the input terminal of the inverter INV1 via the node N3.

The transistor NM6 has the source grounded. The drain of the transistor NM6 is connected to the node N2. The gate of the transistor NM6 is connected to the output terminal of the inverter INV0.

The source of the transistor PM6 is connected to a power supply terminal that receives the supply voltage VDD. The drain of the transistor PM6 is connected via the node N3 to the drain of each of the transistors PM3 and NM3 and the input terminal of the inverter INV1. The gate of the transistor PM6 is connected to the control unit 13, and receives the second control signal SENSE2 from the control unit 13.

The input terminal of the inverter INV0 is connected to the control unit 13, and receives the second control signal SENSE2 from the control unit 13. The output terminal of the inverter INV0 is connected to the gate of the transistor NM6. The inverter INV0 produces an inverted signal of the second control signal SENSE2, and supplies the same to the gate of the transistor NM6.

The input terminal of the inverter INV1 is connected to the node N3. The output terminal of the inverter INV1 is connected to a DOUT terminal for outputting a current detection result. The inverter INV1 outputs, from the DOUT terminal as a detected signal, a signal with a signal level (voltage level) inverted from that at the node N3.

The control unit 13 supplies the first control signal SENSE to the potential control unit 11 and supplies the second control signal SENSE2 to the current amplifier unit 12 and the readout data detection unit 14. The control unit 13 produces the second control signal SENSE2 on the basis of a readout signal REB indicative of the timing of a readout duration for reading data from the memory cell. The control unit 13 has, for example, a delay circuit 30 for producing the second control signal SENSE2 by delaying the readout signal REB.

Figure 3:
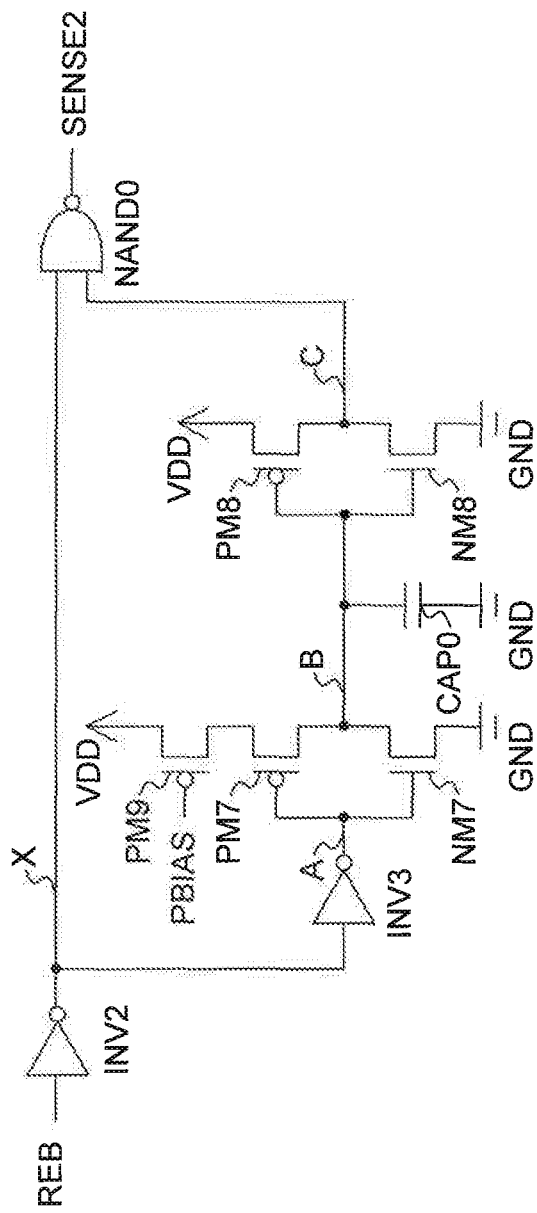
FIG. 3 is a circuit diagram illustrating the configuration of a delay circuit of the first embodiment.

FIG. 3 is a circuit diagram indicative of the configuration of the delay circuit 30. The delay circuit 30 has transistors PM7, PM8, and PM9, which are each a P channel type MOS transistor, transistors NM7 and NM8, which are each an N channel type MOS transistor, a capacitor CAP0, inverters INV2 and INV3, and a NAND gate NAND0 (hereafter simply referred to as the NAND0).

The inverter INV2 receives the input of the readout signal REB and then inverts the signal to supply the resulting signal to the inverters INV3 and NAND0. The inverter INV3 further inverts the signal supplied from the inverter INV2 and then supplies the resulting signal to the gate of each of the transistors PM7 and NM7.

The transistor PM9 has the source to which the supply voltage VDD is applied, the gate to which a bias voltage PBIAS is applied, and the drain connected to the source of the transistor PM7. The drain of the transistor PM7 is connected to the drain of the transistor NM7 and to the gates of the transistors PM8 and NM8. The transistor NM7 has the source grounded.

The capacitor CAP0 has one end connected to a node (a node B) for connecting between the drains of the transistors PM7 and NM7 and the gates of the transistors PM8 and NM8, and the other end grounded.

The transistor PM8 has the source to which the supply voltage VDD is applied, and the drain connected to the drain of the transistor NM8 and one input terminal of the NAND0. The transistor NM8 has the source grounded.

One of the two input terminals of the NAND0 is connected to the output terminal of the inverter INV2. The other of the two input terminals of the NAND0 is connected to the drains of the transistors PM8 and NM8. The NAND0 outputs, as the second control signal SENSE2, a negative AND signal of the signals entered to the two input terminals.

Figure 4:
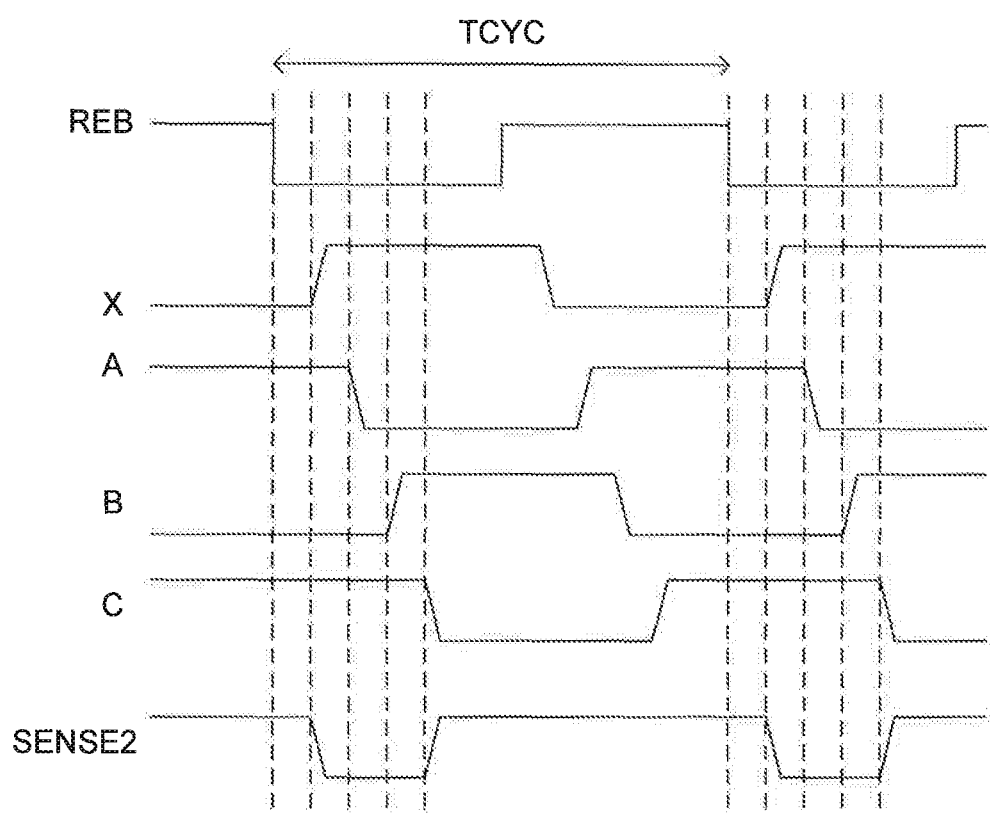
FIG. 4 is a time chart indicative of a signal waveform and a node potential at the time of operation of the delay circuit of the first embodiment.

FIG. 4 is a view illustrating a signal waveform at the time of operation of the delay circuit 30. The readout signal REB has a signal level that changes between "H" and "L," and is indicative of the start timing of the readout duration for reading data from the memory cell. In this embodiment, the falling timing at which the signal level of the readout signal REB changes from "H" to "L" is the start (and end) timing of one cycle readout duration TCYC (hereafter simply referred to as the readout duration TCYC.)

The readout signal REB is inputted to the inverter INV2. The inverter INV2 outputs a signal (indicated as X in FIG. 4) that is acquired by inverting and delaying the readout signal REB.

The output signal from the inverter INV2 is inputted to the inverter INV3. The inverter INV3 outputs a signal (indicated as A in FIG. 4) that is acquired by inverting and delaying the input signal.

The output signal from the inverter INV3 is supplied to the gates of the transistors PM7 and NM7. The drains of the transistors PM7 and NM7 output a signal (indicated as B in FIG. 4) that is acquired by inverting and delaying the signal supplied to the gates.

The output signal from the drains of the transistors PM7 and NM7 is supplied to the gates of the transistors PM8 and NM8. The drains of the transistors PM8 and NM8 output a signal (indicated as C in FIG. 4) that is acquired by inverting and delaying the signal supplied to the gates.

The NAND0 outputs, as the second control signal SENSE2, a negative AND signal of the output signal from the inverter INV2 and the output signal from the drains of the transistors PM8 and NM8. In this manner, produced is the second control signal SENSE2 that has a signal level of "L" for a while from the start of the readout duration TCYC and after that, changes to "H."

Figure 5:
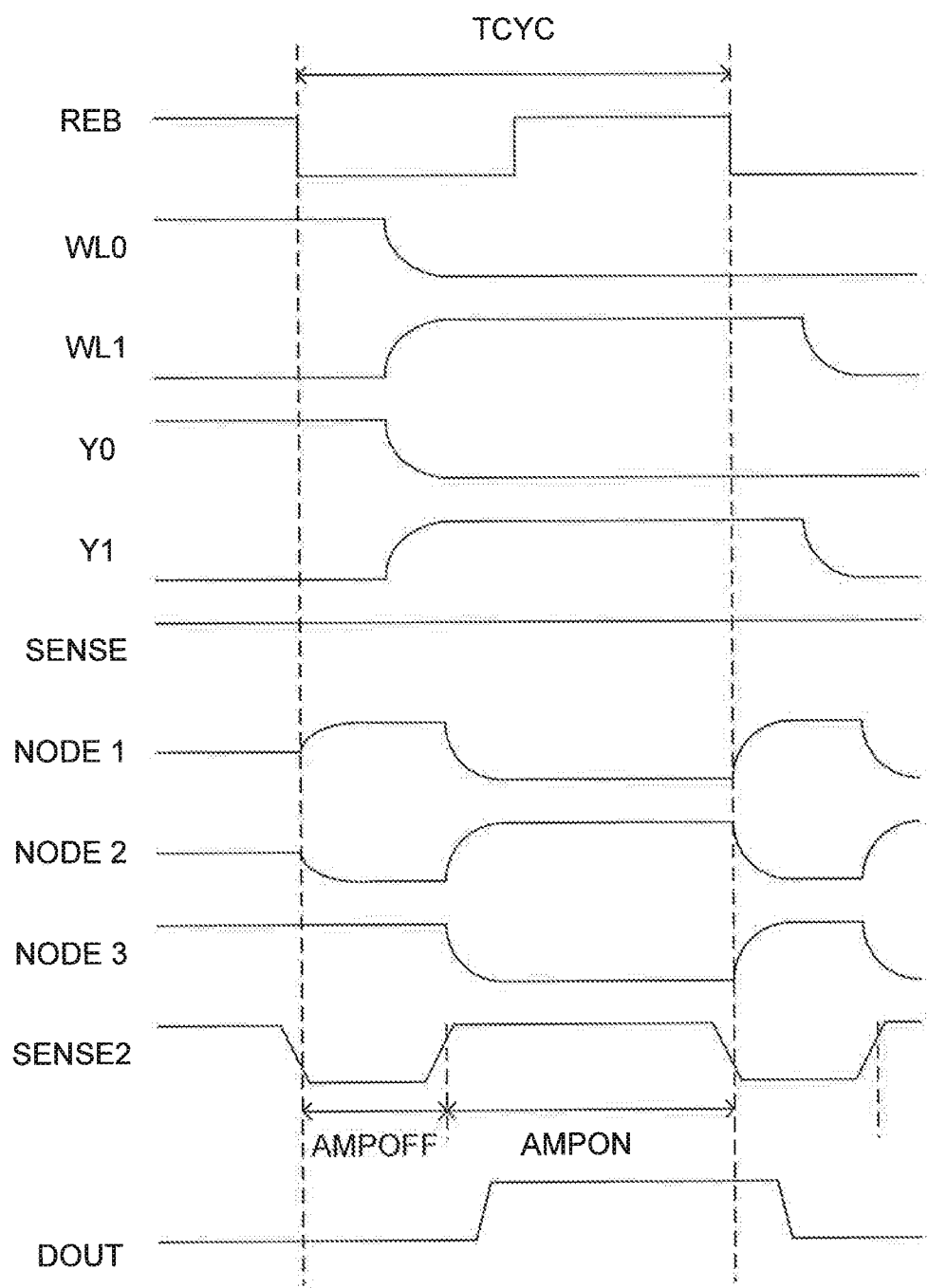
FIG. 5 is a time chart indicative of a signal waveform and a node potential at the time of operation of the sense amplifier circuit of the first embodiment.

A description will next be given of the detection operation performed by the sense amplifier circuit 10 of this embodiment with reference to FIGS. 1, 2, and 5. The AMPOFF of FIG. 5 denotes a sense amplifier inactive duration (a current amplifier unit inactive duration), while the AMPON denotes a sense amplifier active duration (a current amplifier unit active duration). As an example, a description will be given of the case where data is read from the memory cell transistor MC3. Note that FIG. 5 is a time chart indicative of a change in signal level (potential level) when data "1" is stored in the memory cell transistor MC3.

Since the first control signal SENSE is at "H," control is provided so that the potential control unit 11 is in an active mode, the transistors NM4 and NM5 are in an ON state, and the transistor PM4 is in an OFF state.

In the readout duration TCYC, the memory cell transistor MC3 is selected when the word line WL0, the word line WL1, the column signal line Y0, and the column signal line Y1 of FIG. 2 are supplied with an "L" signal, an "H" signal, an "L" signal, and an "H" signal, respectively.

Referring back to FIG. 1, the gate of the transistor PM0 is supplied with the control voltage CLMPREF. The gate of the transistor PM3 is supplied with the reference current control voltage SENREF.

The current flowing through the transistor PM0 flows through the diode-connected transistor NM0. As described above, since the transistors NM0, NM1, NM4, and NM5 constitute a current mirror circuit, the transistor NM1 can also flow a current. This allows the bit line BL to be supplied with a current corresponding to the control voltage CLMPREF, and control is provided so that the potential of the bit line BL is at a predetermined potential.

The reference current control voltage SENREF is set in a manner such that the current flown by the transistor PM3 is an intermediate current between the current flown by the transistor NM3 when data read from the memory cell transistor is "1" and the current flown by the transistor NM3 when the read data is "0." Thus, when data "1" is read out, the potential of the node N3 is transitioned to the ground level ("L"), and the inverter INV1 outputs the inverted signal "H" thereof to the DOUT terminal. On the other hand, when data "0" is read out, the potential of the node N3 is transitioned to the power supply level ("H"), and the inverter INV1 outputs the inverted signal "L" thereof to the DOUT terminal.

In the AMPOFF duration of FIG. 5, the second control signal SENSE2 with a signal level of "L" is supplied to the gates of the transistors PM5 and PM6. Furthermore, a signal of a signal level "H" acquired by inverting the second control signal SENSE2 by the inverter INV0 is supplied to the gate of the transistor NM6. Thus, all the transistors PM5, PM6, and NM6 are turned into an ON state.

At this time, although the current flowing through the transistor NM1 also flows through the transistors PM1 and PM5, the transistor PM5 may be provided with such a size that enables the potential of the node N1 to be charged to the power supply level (the supply voltage VDD level), in the case of which the transistor PM1 is turned into an OFF state. Thus, the current flowing through the transistor NM1 is to be supplied from the transistor PM5.

When the node N1 is at the power supply level ("H"), the transistor PM2 is turned into an OFF state. Since the transistor NM6 is in an ON state, the node N2 is turned to the ground level ("L"), and the transistor NM2 is turned into an OFF state. That is, the path of the current flowing through the transistors PM2 and NM2 is interrupted. When the node N2 is at the ground level ("L"), the transistor NM3 is also turned into an OFF state, and the path of the current flowing through the transistor NM3 is interrupted. At this time, since the transistor PM6 is in an ON state, the node N3 is turned to the power supply level ("H"). The inverter INV1 outputs a signal of a signal level of "L."

On the other hand, in the AMPON duration, the second control signal SENSE2 of a signal level of "H" is supplied to the gates of the transistors PM5 and PM6. Furthermore, a signal of a signal level of "L" acquired by inverting the second control signal SENSE2 by the inverter INV0 is supplied to the gate of the transistor NM6. Thus, all the transistors PM5, PM6, and NM6 are turned into an OFF state.

At this time, when data read out from the memory cell transistor MC3 is "1," the readout current flows through the transistor PM1, and as illustrated in the time chart of FIG. 5, the potential level of the node N1 is lowered. The lowering of the potential level of the node N1 enables the transistor PM2 to flow more current, and the potential level of the node N2 is increased. The increase of the potential level of the node N2 enables the transistor NM3 to flow more current, and the potential level of the node N3 is lowered. The lowering of the potential level of the node N3 causes the inverter INV1 to output a signal of a signal level "H" acquired by inverting the potential level.

On the other hand, when the readout data from the memory cell transistor MC3 is "0," the readout current does not flow through the transistor PM1, and unlike the time chart of FIG. 5, no current flows through the transistors PM2, NM2, and NM3 which constitute a current mirror. On the other hand, since the transistor PM3 allows a current to flow therethrough, the potential level of the node N3 is turned to the power supply level ("H"). Thus, a signal of a signal level of "L" acquired by inverting the potential level is outputted from the inverter INV1.

As described above, the sense amplifier circuit 10 of this embodiment supplies the first control signal SENSE of a signal level of "H" to the potential control unit 11 to turn the same into an active mode, while supplying the second control signal SENSE2 that changes the level thereof between "H" and "L" in the readout duration TCYC, to the current amplifier unit 12 and the readout data detection unit 14. This changes the operational states of the current amplifier unit 12 and the readout data detection unit 14 (the AMPON duration and the AMPOFF duration).

As described above, during the AMPOFF duration, the sense amplifier circuit 10 of this embodiment can interrupt the current path of the transistor PM2 and the current path of the transistor NM3 while supplying a current to the bit line BL (i.e., controlling the potential of the bit line BL). It is thus possible to reduce the current consumption in the current amplifier unit 12 and the readout data detection unit 14.

Furthermore, for readout in long cycles, the AMPOFF duration can be elongated within the readout duration TCYC, thereby effectively reducing current consumption.

Furthermore, in this embodiment, the AMPOFF duration is the precharge duration of the bit line BL, while the AMPON duration is a current amplification duration. That is, in the AMPOFF duration, the first control signal SENSE is supplied to the potential control unit 11 to supply a current to the bit line BL, thereby precharging the bit line BL. It is thus possible to reduce the time to read out data from the memory cell.

Second Embodiment

Figure 6:
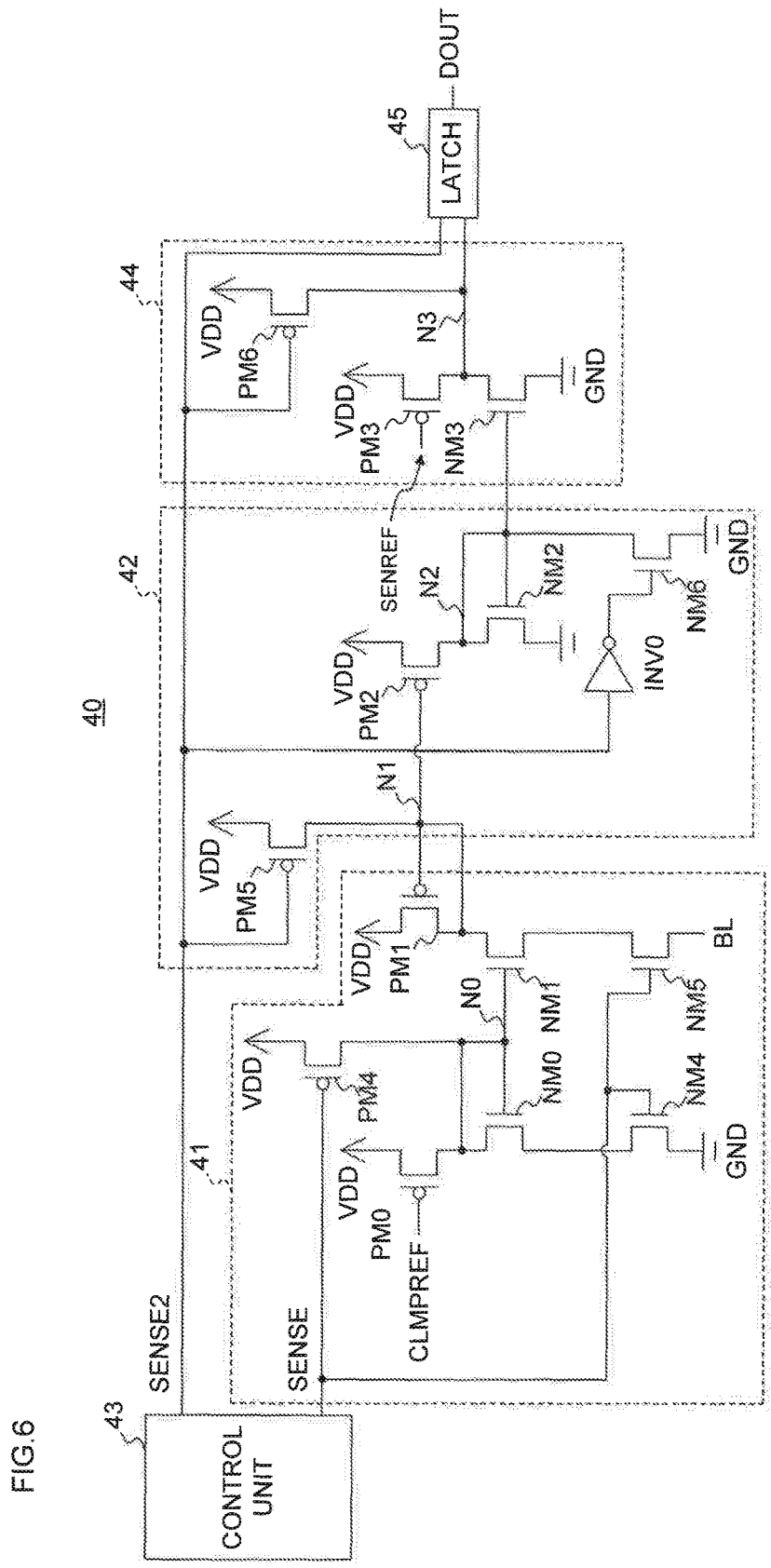
FIG. 6 is a circuit diagram illustrating a configuration of a sense amplifier circuit of a second embodiment.

FIG. 6 is a circuit diagram illustrating a configuration of a sense amplifier circuit 40 according to a second embodiment of the present invention. The sense amplifier circuit 40 is different from the sense amplifier circuit 10 of the first embodiment in having a latch 45 in place of the inverter INV1 as an output unit.

The latch 45 is provided with a control terminal, an input terminal, and an output terminal. The latch 45 allows the control terminal to receive the second control signal SENSE2, and the input terminal to receive an output signal from the transistors PM3 and NM3. When being supplied with the second control signal SENSE2 of a signal level of "H," the latch 45 outputs the inverted signal of a signal inputted to the input terminal. Then, when the second control signal SENSE2 is transitioned from a signal level of "H" to "L," the latch 45 holds the data being outputted at that time.

A potential control unit 41, a current amplifier unit 42, and a readout data detection unit 44 are configured in the same manner as the potential control unit 11, the current amplifier unit 12, and the readout data detection unit 14 of the sense amplifier circuit 10 according to the first embodiment, respectively.

A control unit 43 supplies the first control signal SENSE to the potential control unit 41 and supplies the second control signal SENSE2 to the current amplifier unit 42 and the readout data detection unit 44. The control unit 43 has a delay circuit 50 which delays the readout signal REB indicative of the timing of a readout duration for reading out data from the memory cell to produce the second control signal SENSE2.

Figure 7:
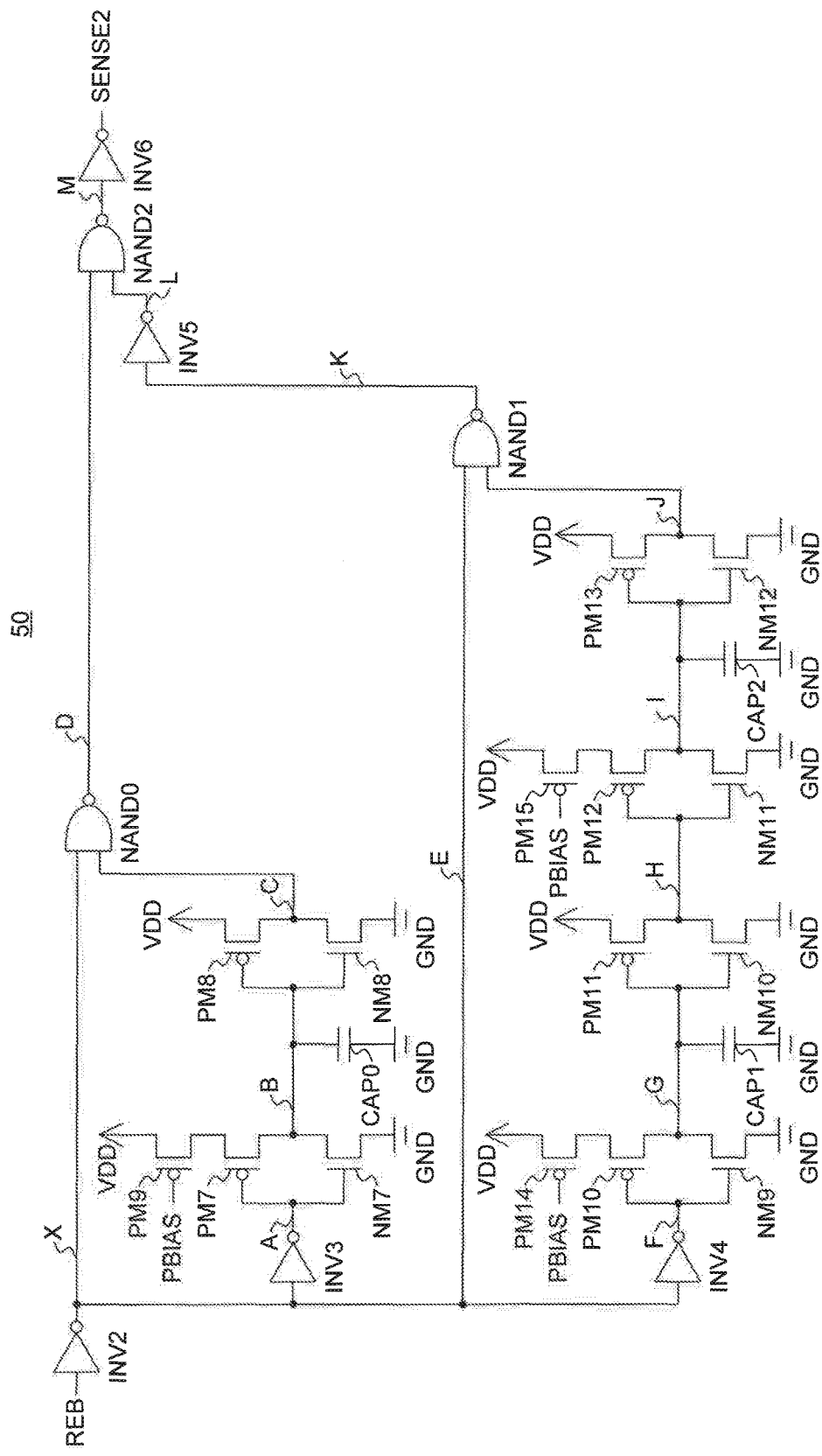
FIG. 7 is a circuit diagram illustrating a configuration of a delay circuit of the second embodiment.

FIG. 7 is a circuit diagram illustrating the configuration of the delay circuit 50. The delay circuit 50 has: transistors PM7, PM8, PM9, PM10, PM11, PM12, PM13, PM14, and PM15 which are each a P channel type MOS transistor; transistors NM7, NM8, NM9, NM10, NM11, and NM12 which are each an N channel type MOS transistor; capacitors CAP0, CAP1, and CAP2; inverters INV2, INV3, INV4, INV5, and INV6; and NAND gates NAND0 and NAND1 (hereafter simply referred to as the NAND0 and the NAND1).

The inverter INV2 receives the input of the readout signal REB and then supplies a signal acquired by inverting the same to the NAND0, the inverter INV3, the NAND1, and the inverter INV4.

The inverter INV3 further inverts the signal supplied from the inverter INV2, and then supplies the resulting signal to the gate of each of the transistors PM7 and NM7.

The transistor PM9 has the source to which the supply voltage VDD is applied, the gate to which the bias voltage PBIAS is applied, and the drain connected to the source of the transistor PM7. The drain of the transistor PM7 is connected to the drain of the transistor NM7, and to the gates of the transistors PM8 and NM8. The transistor NM7 has the source grounded.

The capacitor CAP0 has one end connected to a node (node B) for connecting between the drains of the transistors PM7 and NM7 and the gates of the transistors PM8 and NM8, and the other end grounded.

The transistor PM8 has the source to which the supply voltage VDD is applied, and the drain connected to the drain of the transistor NM8 and to one input terminal of the NAND0. The transistor NM8 has the source grounded.

One of the two input terminals of the NAND0 is connected to the output terminal of the inverter INV2. The other of the two input terminals of the NAND0 is connected to the drains of the transistors PM8 and NM8. The NAND0 outputs a negative AND signal of signals inputted to the two input terminals for supply to the NAND2.

The inverter INV4 further inverts the signal supplied from the inverter INV2 and then supplies the resulting signal to the gates of the transistors PM10 and NM9.

The transistor PM14 has the source to which the supply voltage VDD is applied, the gate to which the bias voltage PBIAS is applied, and the drain connected to the source of the transistor PM10. The drain of the transistor PM10 is connected to the drain of the transistor NM9, and to the gates of the transistors PM11 and NM10. The transistor NM9 has the source grounded.

The capacitor CAP1 has one end connected to a node (node G) for connecting between the drains of the transistors PM10 and NM9 and the gates of the transistors PM11 and NM10, and the other end grounded.

The transistor PM11 has the source to which the supply voltage VDD is applied, and the drain connected to the drain of the transistor NM10 and to the gates of the transistors PM12 and NM11. The transistor NM10 has the source grounded.

The transistor PM15 has the source to which the supply voltage VDD is applied, the gate to which the bias voltage PBIAS is applied, and the drain connected to the source of the transistor PM12. The drain of the transistor PM12 is connected to the drain of the transistor NM11, and to the gates of the transistors PM13 and NM12. The transistor NM11 has the source grounded.

The transistor PM13 has the source to which the supply voltage VDD is applied, and the drain connected to the drain of the transistor NM12 and to one input terminal of the NAND1. The transistor NM12 has the source grounded.

One of the two input terminals of the NAND1 is connected to the output terminal of the inverter INV2. The other of the two input terminals of the NAND1 is connected to the drains of the transistors PM13 and NM12. The NAND1 outputs a negative AND signal of the signals inputted to the two input terminals for supply to the inverter INV5.

The inverter INV5 is connected between the output terminal of the NAND1 and one input terminal of the NAND2. The inverter INV5 supplies a signal acquired by inverting the output signal from the NAND1 to one input terminal of the NAND2.

One of the two input terminals of the NAND2 is connected to the output terminal of the inverter NAND0. The other of the two input terminals of the NAND2 is connected to the output terminal of the inverter INV5. The NAND2 outputs a negative AND signal of the signals inputted to the two input terminals for supply to the inverter INV6.

The inverter INV6 is connected to the output terminal of the NAND2, and outputs, as the second control signal SENSE2, a signal acquired by inverting the output signal from the NAND2.

Figure 8:
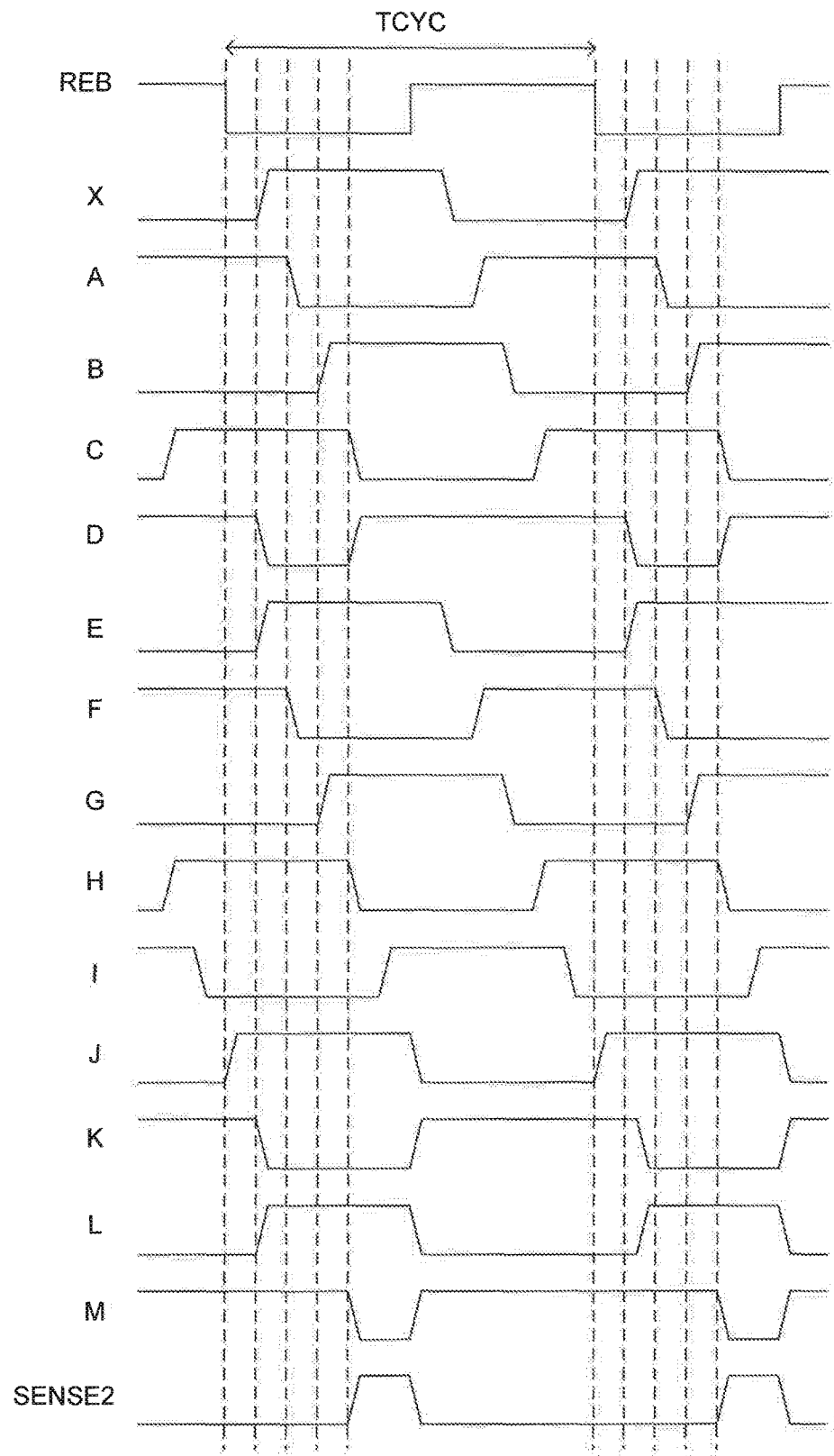
FIG. 8 is a time chart indicative of a signal waveform and a node potential at the time of operation of the delay circuit of the second embodiment.

FIG. 8 is a view illustrating a signal waveform at the time of operation of the delay circuit 50. The readout signal REB has a signal level changed between "H" and "L", and is indicative of the start timing of a readout duration for reading out data from the memory cell. In this embodiment, the falling timing at which the signal level of the readout signal REB is changed from "H" to "L" is the timing of the start (and end) of one cycle readout duration TCYC (hereafter simply referred to as the readout duration TCYC).

The readout signal REB is inputted to the inverter INV2. The inverter INV2 inverts and delays the readout signal REB and then outputs the resulting signal (indicated as X in FIG. 8).

The signal outputted from the inverter INV2 is inputted to the inverters INV3 and INV4, and the NAND0 and the NAND1. The inverter INV3 inverts and delays the input signal and then outputs the resulting signal (indicated as A in FIG. 8).

The output signal from the inverter INV3 is supplied to the gates of the transistors PM7 and NM7. From the drains of the transistors PM7 and NM7, outputted is a signal (indicated as B in FIG. 8) that is acquired by inverting and delaying the signal supplied to the gates.

The output signal from the drains of the transistors PM7 and NM7 is supplied to the gates of the transistors PM8 and NM8. From the drains of the transistors PM8 and NM8, outputted is a signal (indicated as C in FIG. 8) that is acquired by inverting and delaying the signal supplied to the gates.

The NAND0 outputs a negative AND signal (indicated as D in FIG. 8) of the output signal from the inverter INV2 and the output signal from the drains of the transistors PM8 and NM8.

The inverter INV4 outputs a signal (indicated as F in FIG. 8) that is acquired by inverting and delaying the signal supplied from the inverter INV2.

The output signal from the inverter INV4 is supplied to the gates of the transistors PM10 and NM9. From the drains of the transistors PM10 and NM9, outputted is a signal (indicated as G in FIG. 8) that is acquired by inverting and delaying the signal supplied to the gates.

The output signal from the drains of the transistors PM10 and NM9 is supplied to the gates of the transistors PM11 and NM10. From the drains of the transistors PM11 and NM10, outputted is a signal (indicated as H in FIG. 8) that is acquired by inverting and delaying the signal supplied to the gates.

The output signal from the drains of the transistors PM11 and NM10 is supplied to the gates of the transistors PM12 and NM11. From the drains of the transistors PM12 and NM11, outputted is a signal (indicated as I in FIG. 8) that is acquired by inverting and delaying the signal supplied to the gates.

The output signal from the drains of the transistors PM12 and NM11 is supplied to the gates of the transistors PM13 and NM12. From the drains of the transistors PM13 and NM12, outputted is a signal (indicated as J in FIG. 8) that is acquired by inverting and delaying the signal supplied to the gates.

The NAND1 is supplied with the output signal from the inverter INV0 and the output signal from the drains of the transistors PM13 and NM12. The NAND1 outputs a negative AND signal (indicated as K in FIG. 8) of these signals.

The inverter INV3 inverts and delays the output signal from the NAND1 and then supplies the resulting signal (indicated as L in FIG. 8) to the NAND2.

The NAND2 outputs a negative AND signal (indicated as M in FIG. 8) of the output signal from the NAND0 and the output signal from the inverter INV3.

The inverter INV4 outputs, as the second control signal SENSE2, a signal that is acquired by delaying and inverting the output signal from the NAND2.

In this manner, produced is the second control signal SENSE2 of which signal level is "L" for a while from the start of the readout duration TCYC and after that, "H" for a certain period, and changes back to "L."

Figure 9:
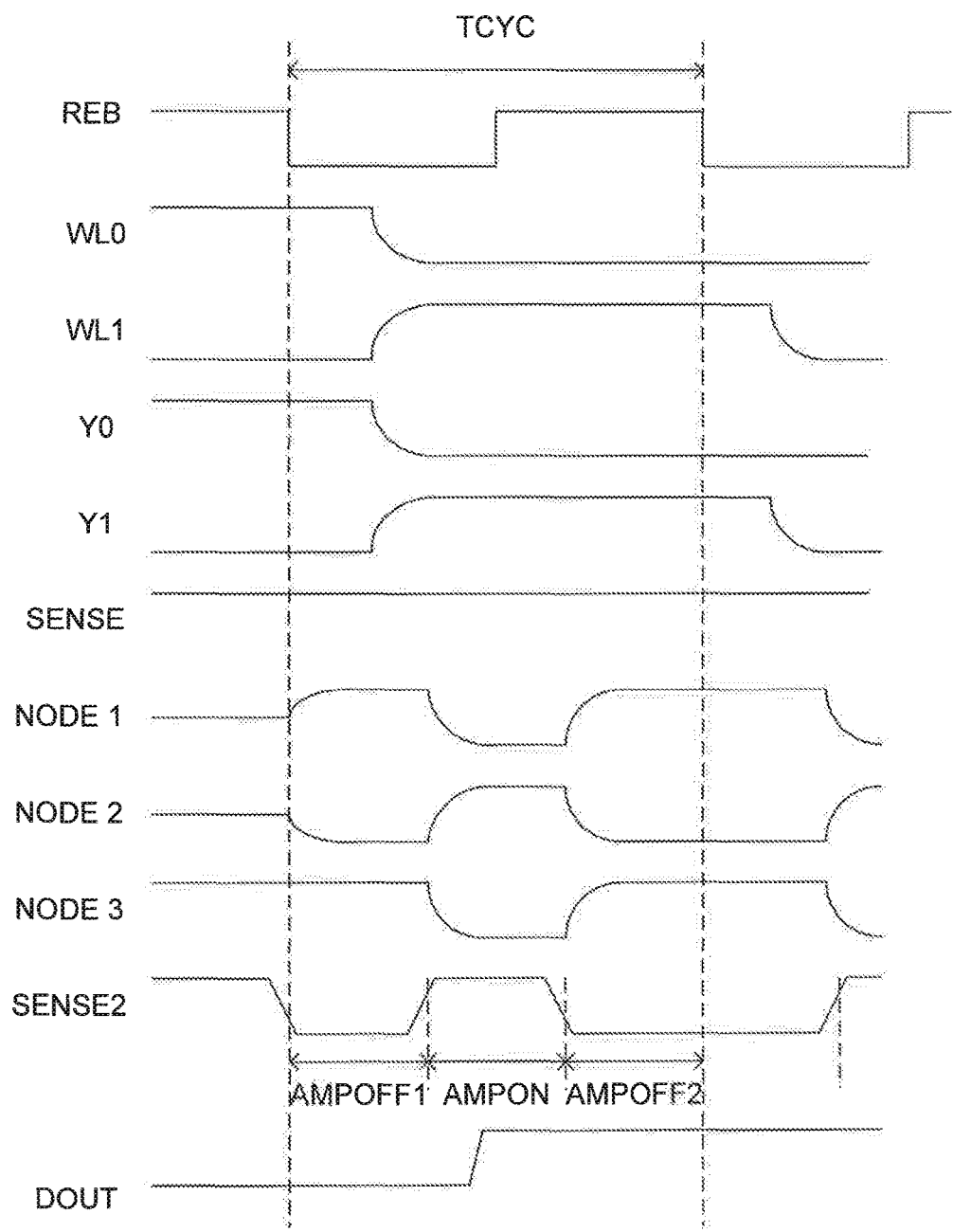
FIG. 9 is a time chart indicative of a signal waveform and a node potential at the time of operation of the sense amplifier circuit of the second embodiment.

A description will next be given of the detection operation performed by the sense amplifier circuit 40 of this embodiment with reference to FIGS. 6, 2, and 9. The AMPOFF1 and AMPOFF2 of FIG. 9 are indicative of a sense amplifier inactive duration, and the AMPON is indicative of a sense amplifier active duration. As an example, the following description will be given of the case where data "1" is stored in the memory cell transistor MC3.

Since the first control signal SENSE is "H," control is provided so that the potential control unit 41 is in an active mode, the transistors NM4 and NM5 are in an ON state, and the transistor PM4 is in an OFF state.

In the readout duration TCYC, the memory cell transistor MC3 is selected when the word line WL0 of FIG. 2, the word line WL1, the column signal line Y0, and the column signal line Y1 are supplied with an "L" signal, an "H" signal, an "L" signal, and an "H" signal, respectively.

Referring back to FIG. 6, the gate of the transistor PM0 is supplied with the control voltage CLMPREF. The gate of the transistor PM3 is supplied with the reference current control voltage SENREF.

The current flowing through the transistor PM0 flows through the diode-connected transistor NM0. As described above, since the transistors NM0, NM1, NM4, and NM5 constitute a current mirror circuit, the transistor NM1 enables a current to flow therethrough. This in turn causes a voltage corresponding to the control voltage CLMPREF to be applied to the bit line BL.

The reference current control voltage SENREF is set in a manner such that the current flown by the transistor PM3 is an intermediate current between the current flown by the transistor NM3 when data read from the memory cell transistor is "1" and the current flown by the transistor NM3 when read data is "0." Thus, when data "1" is read out, the potential of the node N3 is transitioned to the ground level ("L"). At this time, when "H" is applied to the control terminal of the latch 45, the latch 45 outputs the inverted signal "H" thereof to the DOUT terminal. On the other hand, when data "0" is read out, the potential of the node N3 is transitioned to the power supply level ("H"), and the latch 45 outputs the inverted signal "L" thereof to the DOUT terminal.

In the duration of the AMPOFF1 of FIG. 9, the second control signal SENSE2 of a signal level of "L" is supplied to the gates of the transistors PM5 and PM6 and the control terminal of the latch 45. Furthermore, a signal of a signal level "H" acquired by inverting the second control signal SENSE2 by the inverter INV0 is supplied to the gate of the transistor NM6. Thus, all the transistors PM5, PM6, and NM6 are turned into an ON state. Furthermore, the latch 45 is turned into such a state as to hold the previous output.

At this time, although the current flowing through the transistor NM1 also flows through the transistors PM1 and PM5, the transistor PM5 may be provided with such a size that enables the potential of the node N1 to be charged to the power supply level (the supply voltage VDD level), in the case of which the transistor PM1 is turned into an OFF state. Therefore, the current flowing through the transistor NM1 is to be supplied from the transistor PM5.

When the node N1 is at the power supply level ("H"), the transistor PM2 is turned into an OFF state. Since the transistor NM6 is in an ON state, the node N2 is turned to the ground level ("L"), and the transistor NM2 is turned into an OFF state. That is, the path of the current flowing through the transistors PM2 and NM2 is interrupted. When the node N2 is at the ground level ("L"), the transistor NM3 is also turned into an OFF state, and the path of the current flowing through the transistor NM3 is interrupted. At this time, since the transistor PM6 is in an ON state, the node N3 is turned to the power supply level ("H").

On the other hand, in the AMPON duration, the second control signal SENSE2 of a signal level of "H" is supplied to the gates of the transistors PM5 and PM6 and the control terminal of the latch 45. Furthermore, a signal of a signal level of "L" acquired by inverting the second control signal SENSE2 by the inverter INV0 is supplied to the gate of the transistor NM6. Thus, all the transistors PM5, PM6, and NM6 are turned into an OFF state, and the latch 45 outputs the inverted signal of a signal inputted to the input terminal.

At this time, since data read out from the memory cell transistor MC3 is "1," the readout current flows through the transistor PM1, so that the potential level of the node N1 is lowered. The lowering of the potential level of the node N1 enables the transistor PM2 to flow more current, and the potential level of the node N2 is increased. The increase of the potential level of the node N2 enables the transistor NM3 to flow more current, and the potential level of the node N3 is lowered. The lowering of the potential level of the node N3 causes a signal of a signal level of "H" acquired by inverting the potential level to be outputted from the latch 45 to the DOUT terminal.

When the AMPON duration is transitioned to the AMPOFF2 duration, the latch 45 is turned into such a state as to hold the previous output because the second control signal SENSE2 is transitioned from "H" to "L." As described above, since a signal of a signal level of "H" is outputted in the AMPON duration, the latch 45 holds the signal output of a signal level of "H." The operation of each unit in the AMPOFF2 duration is the same as that in the AMPOFF1 duration except the latch 45 holding the output, and again the current path of the transistor PM2 and the current path of the transistor NM3 are interrupted.

As described above, in the AMPOFF1 duration and the AMPOFF2 duration, the sense amplifier circuit 10 of this embodiment can interrupt the current path of the transistor PM2 and the current path of the transistor NM3, while supplying a current (providing potential control) to the bit line BL. It is thus possible to reduce current consumption in the current amplifier unit 42 and the readout data detection unit 44.

Furthermore, in this embodiment, the AMPOFF1 duration is a first amplification interrupted duration (the precharge duration of the bit line BL), the AMPON duration is a current amplification duration, and the AMPOFF2 duration is a second amplification interrupted duration. In this embodiment, elongating the AMPOFF2 duration enables to reduce current consumption without delaying the speed of access to the memory (i.e., without elongating the AMPOFF1 duration). Thus, for readout in a long cycle, it is possible to more effectively reduce current consumption when compared with the first embodiment.

Figure 10:
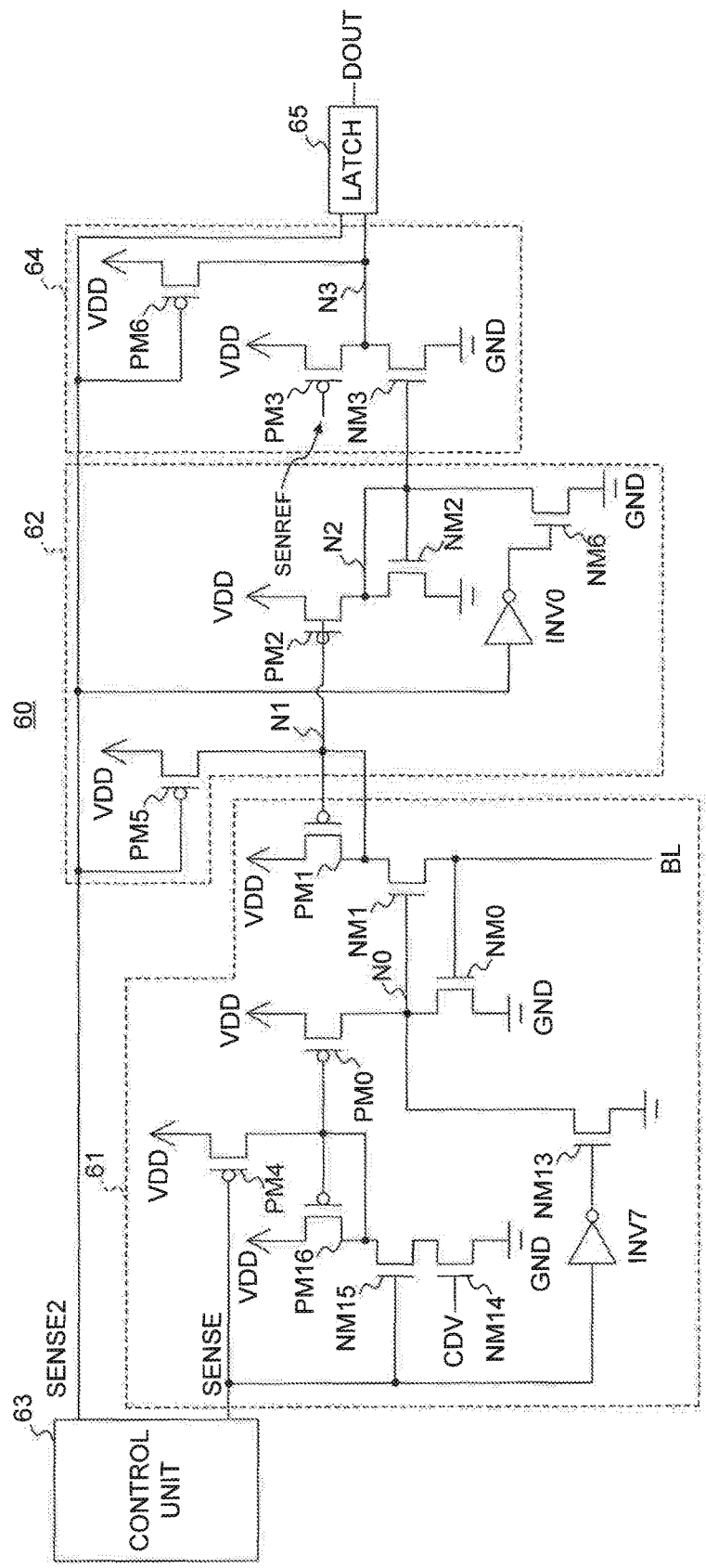
FIG. 10 is a view illustrating a modified example of the sense amplifier circuit of the second embodiment.

FIG. 10 is a circuit diagram illustrating a configuration of a sense amplifier circuit 60 that is a modified example of the sense amplifier circuit according to the second embodiment.

The sense amplifier circuit 60 is different from the sense amplifier circuit 40 of FIG. 6 in the configuration of a potential control unit 61.

The potential control unit 61 is configured from transistors PM0, PM1, PM4, and PM16 which are each a P channel type MOS transistor, transistors NM0, NM1, NM13, NM14, and NM15 which are each an N channel type MOS transistor, and an inverter INV7.

The source of the transistor PM0 is connected to the power supply terminal that receives the supply voltage VDD. The gate of the transistor PM0 is connected to the gate of the transistor PM16. The drain of the transistor PM0 is connected to the drain of the transistor NM0 and is as well connected to the node N0 that connects between the gate of the transistor NM1 and the drain of the transistor NM13.

The source of the transistor PM4 is connected to the power supply terminal that receives the supply voltage VDD. The gate of the transistor PM4 is connected to the control unit 13 and receives the first control signal SENSE from the control unit 13. The drain of the transistor PM4 is connected to a connection line that connects between the gates of the transistors PM0 and PM16, and is as well connected to the drains of the transistor PM16 and the transistor NM15.

The source of the transistor PM1 is connected to the power supply terminal that receives the supply voltage VDD. The gate of the transistor PM1 is connected to the gate of the transistor PM2 via the node N1. The drain of the transistor PM1 is connected in common to the gate of the transistor PM1, and is as well connected to the drain of the transistor NM1.

The source of the transistor PM16 is connected to the power supply terminal that receives the supply voltage VDD. The gate of the transistor PM16 is connected to the gate of the transistor PM0. The drain of the transistor PM16 is connected in common to the gate of the transistor PM16, and is as well connected to the drain of the transistor NM15.

The gate of the transistor NM15 is connected to the control unit 13, and receives the first control signal SENSE from the control unit 13. The drain of the transistor NM15 is connected to the drain and the gate of the transistor PM16 and the drain of the transistor PM14. The source of the transistor NM15 is connected to the drain of the transistor NM14.

The transistor NM14 has the source grounded, and the drain connected to the drain of the transistor NM15. The transistor NM14 has the gate to which a control voltage CDV is applied.

The transistor NM13 has the source grounded, and the drain connected to the gate of the transistor NM1 via the node N0. The gate of the transistor NM13 is connected to the output terminal of the inverter INV7.

The transistor NM0 has the source grounded, and the drain connected to the drain of the transistor PM0. The gate of the transistor NM0 is connected to the bit line BL together with the source of the transistor NM1.

The drain of the transistor NM1 is connected to the drain of the transistor PM1. The gate of the transistor NM1 is connected to the drain of the transistor NM13 via the node N0. The source of the transistor NM1 is connected to the bit line BL via the bit line terminal.

The input terminal of the inverter INV7 is connected to the control unit 13, and receives the first control signal SENSE from the control unit 13. The output terminal of the inverter INV7 is connected to the gate of the transistor NM13. The inverter INV7 supplies a signal acquired by inverting the first control signal SENSE to the gate of the transistor NM13.

The potential control unit 61 operates as a regulator. That is, each of the transistors that constitute the current mirror operates to flow a current in a manner such that the control voltage CDV supplied to the gate of the transistor NM14 and the potential of the bit line BL come closer to each other. This causes a variation in the potential of the node N0 corresponding to the potential of the bit line BL.

Thus, the potential control unit 61 configured as above makes it possible to quickly charge the bit line BL. It is also possible to prevent overshoots when the bit line BL is precharged in the AMPOFF duration.

As described above, in the present invention, the readout duration TCYC includes the AMPOFF duration, and in this duration, the sense amplifier circuit stops the amplification of the current amplifier unit 12 while providing control to the potential of the bit line BL. Thus, according to the present invention, it is possible to detect readout data while reducing current consumption.

Note that the present invention is not limited to the aforementioned embodiments. For example, in the embodiments above, a case in which in the readout duration TCYC, the first control signal SENSE normally at the "H" level is supplied to the potential control unit was described as an example. However, for example, in the second embodiment, the signal level of the first control signal SENSE may also be changed to "H" in the AMPOFF1 duration and the AMPON duration, and to "L" in the AMPOFF2 duration. In this manner, it is possible to further reduce current consumption by changing the signal level of the first control signal SENSE and stopping the operation of the potential control unit in the AMPOFF2 duration.

Furthermore, in the aforementioned embodiments, the sense amplifier circuit that detects the readout current from the memory cell by the current mirror circuit and then outputs data "1" or "0" was described as an example. However, the present invention may also be applied to other sense amplifier circuits.

Furthermore, in the aforementioned embodiments, a case where the current mirror circuits are constituted in three stages was described as an example. However, the number of stages of current mirror circuits is not limited thereto.

Furthermore, in the second embodiment above, described as an example was such a case where the latch circuit (the latch 45 or 65) outputs the inverted signal of a signal inputted to the input terminal when a signal of "H" is applied to the control terminal; latches the signal inputted to the input terminal when the signal applied to the control terminal is transitioned from "H" to "L"; and holds data when another signal is applied to the control terminal. However, operations of the latch circuit are not limited thereto. The latch circuit only have to output a signal of a level corresponding to the potential of the node N3 in the AMPON duration, and output a signal of which level is held in the AMPOFF duration.

This application is based upon and claims the benefit of priority from the prior Japanese Patent Application No. 2016-228830 filed on Nov. 25, 2016, the entire contents of which are incorporated herein by reference.

What is claimed is:

1. A sense amplifier for detecting data read from a memory cell, the sense amplifier comprising:
   a potential control unit configured to supply a current to a bit line connected to the memory cell within a data readout duration so as to control a potential of the bit line;
   a current amplifier unit configured to amplify, when activated, a readout current flowing from the memory cell into the bit line so as to produce an amplified current;
   a detection unit configured to detect data read from the memory cell on a basis of the amplified current; and
   a control unit configured to control the activation of the current amplifier unit,
   wherein the data readout duration includes each of a current amplification duration, during which the current amplifier unit performs amplification, and a first amplification interrupted duration, during which the current amplifier unit stops amplification, and
   wherein the control unit interrupts a current path in the current amplifier unit so as to deactivate the current amplifier unit in the first amplification interrupted duration.

2. The sense amplifier according to claim 1, wherein the potential control unit precharges the bit line in the first amplification interrupted duration.

3. The sense amplifier according to claim 2, comprising:
   a first node configured to connect between the potential control unit and the current amplifier unit; and
   a second node configured to connect between the current amplifier unit and the detection unit, wherein
   the current amplifier unit
   turns, in the first amplification interrupted duration, a potential of the first node and a potential of the second node to a fixed potential, and
   turns, in the current amplification duration, the potential of the first node to a potential corresponding to the readout current and the potential of the second node to a potential corresponding to the amplified current.

4. The sense amplifier according to claim 3, wherein
   the detection unit compares the potential of the second node with a threshold value to provide a comparison result, and outputs a detected signal indicative of the comparison result.

5. The sense amplifier according to claim 4, wherein
   the data readout duration includes a second amplification interrupted duration, and
   the current amplifier unit stops amplifying the readout current in the second amplification interrupted duration.

6. The sense amplifier according to claim 5, wherein the detection unit
   outputs, in the current amplification duration, the detected signal indicative of the comparison result between the potential of the second node and the threshold value, and
   outputs, in the second amplification interrupted duration, the detected signal that holds a signal level in the current amplification duration.

7. The sense amplifier according to claim 3, wherein the current amplifier unit includes a current mirror circuit configured to amplify the readout current at a current ratio of 1:m (m>1), and turns the potential of the second node to a potential corresponding to a current m times the readout current.

8. The sense amplifier according to claim 1, wherein the potential control unit includes a current mirror circuit configured to receive a control voltage and then supply a control current corresponding to the control voltage to the bit line, and controls the potential of the bit line on a basis of the control current.

9. The sense amplifier according to claim 1, wherein the potential control unit is configured from a regulator circuit configured to receive a control voltage and controls the potential of the bit line to a potential corresponding to the control voltage.

10. The sense amplifier according to claim 1, wherein the current amplifier unit is supplied with an operation control signal and then stops amplifying the readout current and an amplification operation depending on a signal level of the operation control signal.

11. The sense amplifier according to claim 10, further comprising a signal generation unit configured to produce the operation control signal on a basis of a readout start signal indicative of a start timing of the data readout duration.

* * * * *